(12) United States Patent
Riccò

(10) Patent No.: US 6,172,913 B1
(45) Date of Patent: Jan. 9, 2001

(54) METHOD FOR FAST PROGRAMMING FLOATING GATE MEMORIES BY TUNNEL EFFECT

(75) Inventor: Bruno Riccò, Bologna (IT)

(73) Assignee: STMicroelectronics S.r.l., Agrate Brianza (IT)

( * ) Notice: Under 35 U.S.C. 154(b), the term of this patent shall be extended for 0 days.

(21) Appl. No.: 09/344,425

(22) Filed: Jun. 25, 1999

(30) Foreign Application Priority Data

Jun. 26, 1998 (IT) .............................................. TO98A0557

(51) Int. Cl.[7] .................................................. G11C 16/04
(52) U.S. Cl. .................. 365/185.28; 365/185.18
(58) Field of Search ..................... 365/185.28, 185.18, 365/185.24

(56) References Cited

U.S. PATENT DOCUMENTS

| | | | |
|---|---|---|---|
| 5,901,084 | * | 5/1999 | Ohnakado ........................ 365/185.18 |
| 5,986,931 | * | 11/1999 | Caywood ........................ 365/185.06 |
| 6,009,017 | * | 12/1999 | Gus et al. ........................ 365/185.28 |
| 6,011,287 | * | 1/2000 | Itoh et al. ........................ 365/185.28 |

OTHER PUBLICATIONS

Ricco, B. and A. Pieracci, "Tunneling Bursts for Negligible SILC Degradation," *IEEE Transactions on Electron Devices*, 46(7):1497–1500, 1999.

* cited by examiner

*Primary Examiner*—Vu A. Le
(74) *Attorney, Agent, or Firm*—Theodore E. Galanthay; E. Russell Tarleton; Seed IP Law Group

(57) ABSTRACT

A method for fast programming by tunnel effect a floating gate memory cell having a floating gate region separated from a substrate region by a gate oxide layer, wherein an electric field of at least 10 MV/cm is applied to the gate oxide layer for a programming time less than or equal to 100 ns, for example in the range between 20 and 100 ns, and in one embodiment preferably of approximately 50 ns. The gate oxide layer is preferably less than 10 nm. With the foregoing, floating gate memory cells operating as single level or multilevel RAM cells, of a static or dynamic type, or as flash or EEPROM cells, can be obtained where the programming time is substantially reduced.

11 Claims, 1 Drawing Sheet

METHOD FOR FAST PROGRAMMING FLOATING GATE MEMORIES BY TUNNEL EFFECT

TECHNICAL FIELD

The present invention relates to a method for fast programming floating gate memory cells by tunnel effect, wherein the term "programming" means the injection or extraction of charges from the floating gate of the cells by the Fowler-Nordheim effect.

BACKGROUND OF THE INVENTION

Memory cells of the EEPROM and flash (fully Fowler-Nordheim) type are programmed by tunnel effect, which can render programming slow for reasons of reliability. Typically, this operation requires a few milliseconds, i.e., a much longer time than the duration of the clock pulses used in current digital electronic circuits. This slowness constitutes a disadvantage for the use of this type of memory, such as ROMs (Read Only Memories of the programmable and erasable types), and prevents them from being used as read and write devices (RAM—Random Access Memory).

For RAM applications, another important parameter is represented by the memory endurance, i.e., the maximum number of programming cycles that the memory is able to withstand (before it ceases being programmable within the times and according to the modalities specified). RAM memories normally have to be written and erased a far higher number of times than ROMs (although of the programmable type).

On the other hand, the programming time ($T_{pr}$) for floating gate cells is inversely proportional to the current used for injecting or extracting electrons into or from the floating gate, which, in the case where the tunnel effect is employed, exponentially depends upon the electric field ($F_{ox}$) applied to the oxide region that separates the floating gate region from the conducting regions of the cell. It is thus evident that an increase (although modest) of this electric field makes it possible to substantially increase the programming current, until the programming times are reduced to values similar to those normally used for RAM memories (typically, around 100 ns or lower).

At present, however, it is not considered feasible to increase the electric field applied during programming in that it is generally believed that its increase would seriously jeopardize the reliability of the tunnel oxide. In fact, it is known that the application of a strong electric field to the insulating oxide layers produces irreversible changes in the electrical properties of the insulating layers themselves; in particular, the phenomenon of greatest interest, referred to as SILC (Stress Induced Leakage Current), determines an increase in the conductivity of the insulating layer when low value electric fields are applied, thus giving rise to leakages which can jeopardize data retention of the floating gate cells.

In detail, it is known that the SILC phenomenon increases as the applied electric field ($F_{ox}$) and the programming time ($T_{pr}$) increase. On the other hand, since in programming floating gate memory cells it is necessary to discuss in terms of a given amount of charge being transferred from or to the floating gate, $F_{ox}$ and $T_{pr}$ necessarily vary inversely with respect to one another; i.e., the increase of one entails the reduction of the other. Consequently, as regards the SILC resulting from programming operations for which a strong electric field is to be used to reduce the programming time substantially, it is essential to know whether the negative effect due to the increase in the field prevails or not over the positive effect induced by the reduction in the programming time.

Currently, it is generally believed that the negative effect prevails and that an increase in the electric field with respect to the currently adopted values(on the order of 8 MV/cm) leads to unsatisfactory reliability features. This belief is based on the results of experiments carried out with programming times $T_{pr}$ of up to 1 $\mu$s which have actually shown that the oxide decay increases as the programming electric field increases.

SUMMARY OF THE INVENTION

The present invention provides a fast programming method, whereby the level of oxide decay may be zero or negligible.

In accordance with the invention, a floating gate memory is provided that enables a fast programming method of floating gate memory cells by tunnel effect.

Based upon studies carried out by the inventor, it has been shown that, given the same transferred charge, the behavior of SILC is not monotonic and that decay, in fact, increases as the programming time decreases (with consequent increase in the electric field) up to a certain value (that is, in the range of values so far explored, from which it is difficult to increase the value of the programming electric field without definitively degrading the memory cell), and then starts decreasing.

From the physical standpoint, the decrease in the decay of the oxide layer as the programming time decreases (with simultaneous increase in the electric field applied) is probably due to the characteristic times of formation of permanent decay which is not an instantaneous phenomenon, since it requires modification of a lattice type. Consequently, by programming the memory cells with voltage pulses shorter than or comparable with these characteristic times, decay is inhibited.

In particular, the study of the phenomena linked to fast programming on devices that are widely representative of the state of the art indicates that the values of the programming times at which the reversal of the trend occurs are within the region of a few dozen nanoseconds, and hence within the range of the typical operation times of modern integrated circuits.

Consequently, with programming times lower than or equal to 100 ns and electric fields on the tunnel oxide layer greater than or equal to 10 MV/cm, it is possible to program floating gate memory cells and prevent the SILC phenomenon from arising to an appreciable extent.

BRIEF DESCRIPTION OF THE DRAWINGS

For a better understanding of the present invention, embodiments thereof will now be described to provide non-limiting examples, with reference to the attached drawings wherein.

DETAILED DESCRIPTION OF THE INVENTION

Figure 1:
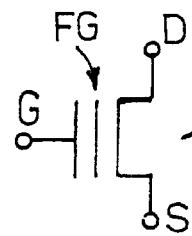
FIG. 1 shows an equivalent electrical diagram of a floating gate memory cell.

In FIG. 1, a floating gate memory cell 1 is shown having source S, drain D, and control gate G electrodes and a floating gate electrode region FG wherein charge is stored that determines the turning on or off condition of the memory cell 1 when the cell 1 is suitably biased in a per se known way.

Figure 2:
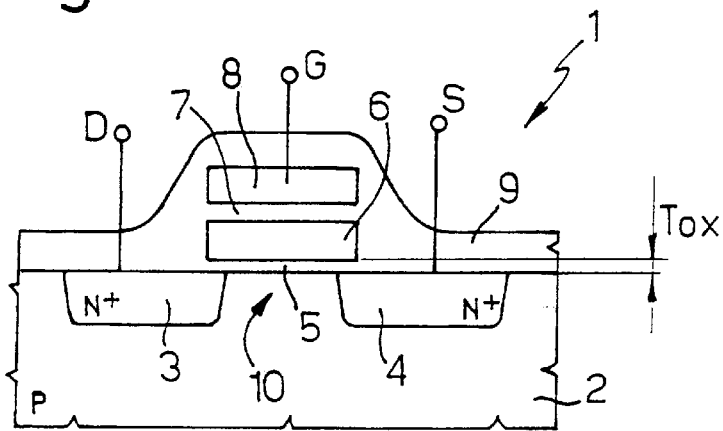
FIG. 2 shows a cross section through a semiconductor material wafer implementing the memory cell of FIG. 1.

FIG. 2 shows a cross section through a semiconductor material wafer housing the memory cell 1 according to a first embodiment, comprising a P-type substrate 2 housing an $N^+$-type drain region 3 and an $N^+$-type source region 4, which are connected to the respective source electrode S and drain electrode D and delimit there between a channel region 10 formed by the substrate 2 itself. A gate oxide layer 5 with a thickness $T_{ox}$ separates and electrically insulates the substrate 2 from a floating gate region 6, typically of polycrystalline silicon; an interpoly dielectric layer 7 separates the floating gate region 6 from a control gate region 8, formed in a word line, typically of polycrystalline silicon. An oxide region 9 covers the substrate 2 and the control gate region 8, completely insulating the floating gate region 6 from outside.

The amount of charge in the memory cells 1 is modified by writing or programming the memory cell by tunnel effect, that is, by applying a high voltage between the control gate region 8 and, generally, the source region 4 (or the channel region 10), so as to inject or extract charges from the floating gate region 6, capacitively coupled to the control gate region 8.

In particular, according to the invention, by applying a high voltage between the control gate region 8 and either the drain region 3 or the source region 4 (or the substrate 2) so as to determine an electric field on the gate oxide layer 5 of at least 10 MV/cm for a time of a few dozen ns (from 20–30 ns up to 100 ns, preferably approximately 50 ns), it is possible to program the memory cell 1 without this undergoing appreciable decay.

Figure 3:
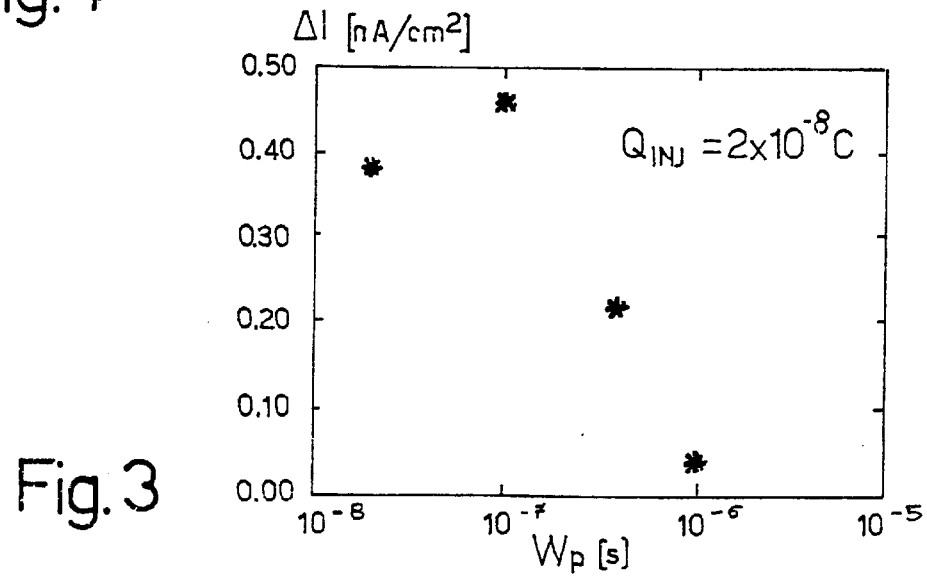
FIG. 3 shows the effects of the experiments of constant charge 10 programming on SILC as the programming time varies.

Referring to FIG. 3, shown therein is the measured plot of SILC versus the duration $W_p$ of the programming pulse in the presence of a high value of the electric field applied to capacitors under conditions of constant injected or extracted charge. As may be noted, the SILC (measured as current increase $\Delta I$ at a given gate voltage) presents a non-monotonic behavior, increasing (with the value of the applied electric field) as the pulse duration $W_p$ decreases, up to a critical value, after which the degradation reduces (notwithstanding the increase in the applied electric field value).

Figure 4:
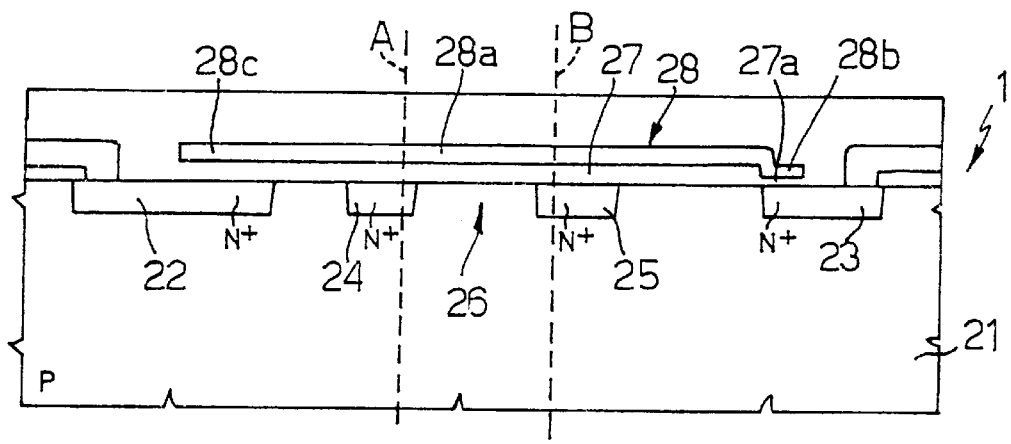
FIG. 4 shows a different cross section, taken along a broken line, through a semiconductor material wafer and for a different implementation technology of the cell of FIG. 1.

The above is valid for any type of floating gate memory cell, whether of the EEPROM type or of the flash type and independently on the structure of the memory cell 1, whether of the polysilicon double layer type or of the polysilicon single layer type. For example, FIG. 4 shows a different structure of memory cell 1 corresponding to a single polysilicon layer solution. In detail, in FIG. 4, which shows a cross section taken along three non-aligned planes mutually delimited in FIG. 4 by dashed lines A) and, B, the memory cell 1 comprises a P-type substrate 21 housing $N^+$-type regions including a control gate region 22, a tunnel injector region 23, a drain region 24, and a source region 25. The drain region 24 and source region 25 delimit therebetween a channel region 26 formed by the substrate 21.

A gate oxide layer 27 extends above the substrate 21, and one portion thereof 27a, above the tunnel injector region 23, has a thickness (equal to $T_{ox}$) smaller than the rest. In turn, a completely insulated polysilicon region 28 extends above the oxide layer 27. The polysilicon region 28 comprises a first portion 28a (at the center in the Figure) extending above the channel region 26 and forming the floating gate of the cell 1; a second portion 28b, on the right, at the reduced thickness oxide portion 27a, forming a programming region for injecting or extracting charges by tunnel effect; and a third portion 28c (on the left) extending above the control gate region 22 and capacitively coupled to the latter.

In the embodiment of FIG. 4, by applying a high voltage between the control gate region 22 and the tunnel injector region 23 in such a way as to determine an electric field on the reduced thickness oxide portion 27a of at least 10 MV/cm for a short time, it is possible to program the memory cell without the latter undergoing appreciable decay.

From the above, there arises the possibility of using floating gate transistors to make memories with write access times comparable to those of modem DRAM (Dynamic Random Access Memory) cells for applications both of the fast programming ROM type and of the RAM type, whether static or dynamic.

The possibility of preventing the problem of SILC (and hence the progressive increase in oxide leakages) enables the design of memory cells essentially on the basis of the conductivity that may be accepted for low values of the electric field applied to the original oxide layer, studying a compromise between data retention times, thickness of the oxide layer 5, and programming voltage, that determine obtaining memory cells usable for RAM cells of the static type, rather than the dynamic type, or else for fast programming nonvolatile memories.

Once the value of the programming electric field has been established, in order to use voltages that may be easily managed in integrated circuits (and in nonvolatile memories in particular), it would be advantageous to use particularly thin oxide layers. On the other hand, the conductivity of the oxide layer, in the presence of a low value of the applied electric field, increases as the thickness of the oxide layer decreases.

Consequently, by using relatively thick oxide layers ($T_{ox}$ greater than 5 nm) and preventing SILC by means of fast programming, it is possible to make the charge loss by the floating gate region negligible, thus providing memories (operating also as RAMs) of a basically static type (as well as of a fast programming nonvolatile type). In this case, the programming voltages are necessarily high (typically 13–15 V on the gate oxide layer, which may require even higher voltages between the control gate region 8 and the regions 2, 3 or 4 because of the capacitive coupling between the floating gate region 6 and the control gate region 8). On the other hand, the use of very thin gate oxide layers may lead to conductivity values at such low fields as to require refreshing of stored information.

In practice, according to an embodiment of the invention, it is possible to implement a memory cell having a gate oxide layer of a thickness of approximately 5 nm. Such a memory cell would require a refresh time on the order of one hour. Namely, it could go an hour or more before a refresh is needed to be performed. This would provide substantial advantages (above all from the power consumption standpoint) as compared to the present DRAM cells, in which refresh times on the order of milliseconds are necessary.

In addition to the possibility of using the increase in data retention time directly for lengthening the refresh time in DRAM memories of the traditional type, this increase may enable the creation of multilevel (and consequently very high density) DRAM memories, wherein maintaining the stored charge is of fundamental importance.

In practice, by using the concept of fast programming and high electric field, according to the compromise chosen between these two quantities (with programming times equal to or smaller than 100 ns, down to 20–30 ns, and for instance, at 50 ns, and programming electric fields of at least 10 MV/cm and up to 12–13 MV/cm and beyond, provided that the associated circuit so permits) as well as according to the thickness of the oxide layer (between 4 and 8 nm and even smaller, provided that technology and retention times so allow, for example 5 nm), according to different embodiments, it is possible to obtain floating gate memory cells that fall within one of the following types:

1) Fully Fowler-Nordheim flash (or EEPROM) memory cell, possibly of the multilevel type;
2) High programming voltage static RAM memory cell;
3) Low refresh frequency dynamic RAM memory cell;
4) Multilevel DRAM memory cell (with refresh frequencies possibly similar to present ones in order to limit loss of charge).

Finally, it is clear that modifications and variations may be made to the described programming method and to the floating gate memory cell shown herein without departing from the scope of the invention as defined by the accompanying claims. In particular, it is emphasized that the structures of the memory cells shown in FIGS. 2 and 4 are merely examples and that the invention is also applicable to floating gate cells having different geometries.

What is claimed is:

1. A method for fast programming, by tunnel effect, a floating gate memory cell, comprising:
   applying an electric field of at least 10 MV/cm for a programming time less than or equal to 100 ns to a gate oxide layer separating a substrate region from the floating gatecell.

2. The method of claim 1, wherein the programming time is comprised in the range of 20 and 100 ns.

3. The method of claim 1, further comprising forming the gate oxide layer of said floating gate memory cell to a thickness of less than 10 nm.

4. The method of claim 3, wherein said gate oxide layer of the floating gate memory cell is formed to a thickness in the range of 4 nm and 8 nm.

5. The method of claim 1, wherein the programming time is approximately 50 ns.

6. The method of claim 1, wherein the gate oxide layer of the floating gate oxide memory cell is formed to a thickness of approximately 5 nm.

7. A method for fast programming a floating gate memory cell having a floating gate region separated from a substrate region by a gate oxide layer having a thickness in the range of 1 nm to 10 nm, the method comprising:
   applying a voltage in the range of 10 MV per centimeter to 20 MV per centimeter to a control gate region on the memory cell for a period of time less than or equal to 100 ns to form an electric field of at least 10 MV per centimeter in the gate oxide layer.

8. The method of claim 7, wherein the period of time is in the range of 20 ns to 100 ns.

9. The method of claim 7, wherein the period of time is approximately equal to 50 ns.

10. The method of claim 7, wherein the thickness of the gate oxide layer is in the range of 4 nm to 8 nm.

11. The method of claim 7, wherein the thickness of the gate oxide layer is approximately equal to 5 nm.

* * * * *